US006765442B2

(12) United States Patent
Kane

(10) Patent No.: US 6,765,442 B2
(45) Date of Patent: Jul. 20, 2004

(54) RF PULSE POWER AMPLIFIER

(75) Inventor: Michael G. Kane, Skillman, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 10/383,446

(22) Filed: Mar. 7, 2003

(65) Prior Publication Data

US 2003/0179044 A1 Sep. 25, 2003

Related U.S. Application Data

(60) Provisional application No. 60/366,980, filed on Mar. 22, 2002.

(51) Int. Cl.$^7$ .............................................. H03F 3/217
(52) U.S. Cl. ................................. 330/251; 330/207 A
(58) Field of Search ............................ 330/251, 207 A, 330/10, 252, 255, 301, 116

(56) References Cited

U.S. PATENT DOCUMENTS 2,467,778 A * 4/1949 Redmond ..................... 330/55
3,887,879 A * 6/1975 Radovsky ................... 330/257
5,945,878 A * 8/1999 Westwick et al. ........... 330/301

* cited by examiner

*Primary Examiner*—Henry Choe
(74) *Attorney, Agent, or Firm*—William J. Burke, Esq.

(57) ABSTRACT

A radio frequency (RF) pulse power amplifier biased with a relatively low supply voltage generates one or more RF pulses having a relatively large output power. The RF pulse power amplifier may be configured as a push-pull power amplifier operating in class D mode including first and second sections, balanced-to-unbalanced (balun) transformer, and a load resistor coupled across the output winding of the balun transformer. Each section has a current source providing bias current, a MOS transistor, and a pair of bipolar transistors. Each section receives its input digital signal at the MOS transistor, which acts as a current switch for a bias current from a current source. With a relatively small voltage change in response to the input digital signal, the MOS transistor switches the bias current between itself and a transistor pair used to drive the corresponding half (input winding) of the balun transformer.

8 Claims, 1 Drawing Sheet

RF PULSE POWER AMPLIFIER

CROSS-REFERENCE TO RELATED APPLICATIONS

This application claims the benefit of the filing date of U.S. provisional application No. 60/366,980, filed on Mar. 22, 2002.

BACKGROUND OF THE INVENTION

1. Field of the Invention

The present invention relates to low-voltage circuits for generating broadband radio frequency (RF) pulses, and, in particular, to an RF power amplifier generating high-power pulses.

2. Description of the Related Art

Radio frequency (RF) applications increasingly employ integrated circuit (IC) technology, but, until recently, only discrete semiconductor components, or small-scale bipolar or gallium-arsenide (GaAs) ICs, could operate at RF and microwave frequencies. Metal-oxide semiconductor (MOS) technology employed for ICs may allow for operation at frequencies of a gigahertz and greater. In addition, the combination of bipolar and MOS transistors in BiCMOS technology allows for operation of ICs at even higher frequencies. Silicon-germanium (SiGe) bipolar transistors further raise the upper limit of IC operation, and experimental digital circuits operating at tens of gigahertz, previously the domain of discrete transistors and small-scale ICs, have been built.

Within the area of RF applications, wireless networking is becoming increasingly popular, though transceivers are still expensive. One technique employed for communication between transceivers in wireless networking uses short RF pulses, rather than using a traditional modulated carrier, to transfer data. For example, an RF output waveform (representing a data symbol) of a transceiver might comprise a few cycles of a sine wave at a frequency of a few gigahertz. When short RF pulses are used, the RF power is spread out over a larger frequency band than when a conventional, data-modulated carrier is employed for communication. Spreading the RF power over a larger frequency band may exhibit the advantage of permitting a large output power to meet FCC regulations.

When ICs are employed in RF applications, even though the ICs are operating at higher frequencies, the ICs are also operating at lower voltages. However, low-voltage ICs typically operate with low output power levels that are often incompatible with the power levels required for transmission.

SUMMARY OF THE INVENTION

The problems in the prior art are addressed in accordance with the principles of the present invention by a pulse power amplifier biased with a relatively low supply voltage that generates one or more pulses having a relatively large output power. The pulse power amplifier biased with a relatively low supply voltage generates one or more pulses having a relatively large output power. The pulse power amplifier provides a short pulse from a pair of pulsed input digital signals. The pulse power amplifier includes two sections, each section driving a corresponding half of a balanced-to-unbalanced (balun) transformer, to generate a portion of the output pulse. Each section receives its input digital signal at a MOS transistor which acts as a current switch for a bias current from a current source. With a relatively small voltage change in response to the input digital signal, the MOS transistor switches the bias current between itself and a transistor pair used to drive the corresponding half of the balun transformer. Such configuration may allow for a MOS circuit, which operates with a relatively low supply voltage (and low power), that is coupled to the pulse power amplifier to generate an output pulse having a relatively high output power.

According to one embodiment, the present invention is a circuit including a push-pull power amplifier configured to operate in a switching mode. The push-pull amplifier comprises a first section coupled to receive a first input signal and a second section coupled to receive a second input signal, wherein each of the first and second sections comprises a metal oxide semiconductor (MOS) transistor, a transistor pair, and a current source providing a bias current to the MOS transistor and the transistor pair, wherein the MOS transistor is coupled to the transistor pair so as to switch the bias current between the MOS transistor and the transistor pair in response to the corresponding input signal. The circuit further includes a signal combiner adapted to receive signals from the first and second sections to drive a load impedance, wherein, when the MOS transistor of the first section switches the bias current to the transistor pair, the transistor pair drives the load impedance through the signal combiner in one direction, and, when the MOS transistor of the second section switches the bias current to the transistor pair, the transistor pair drives the load impedance through the signal combiner in another direction.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
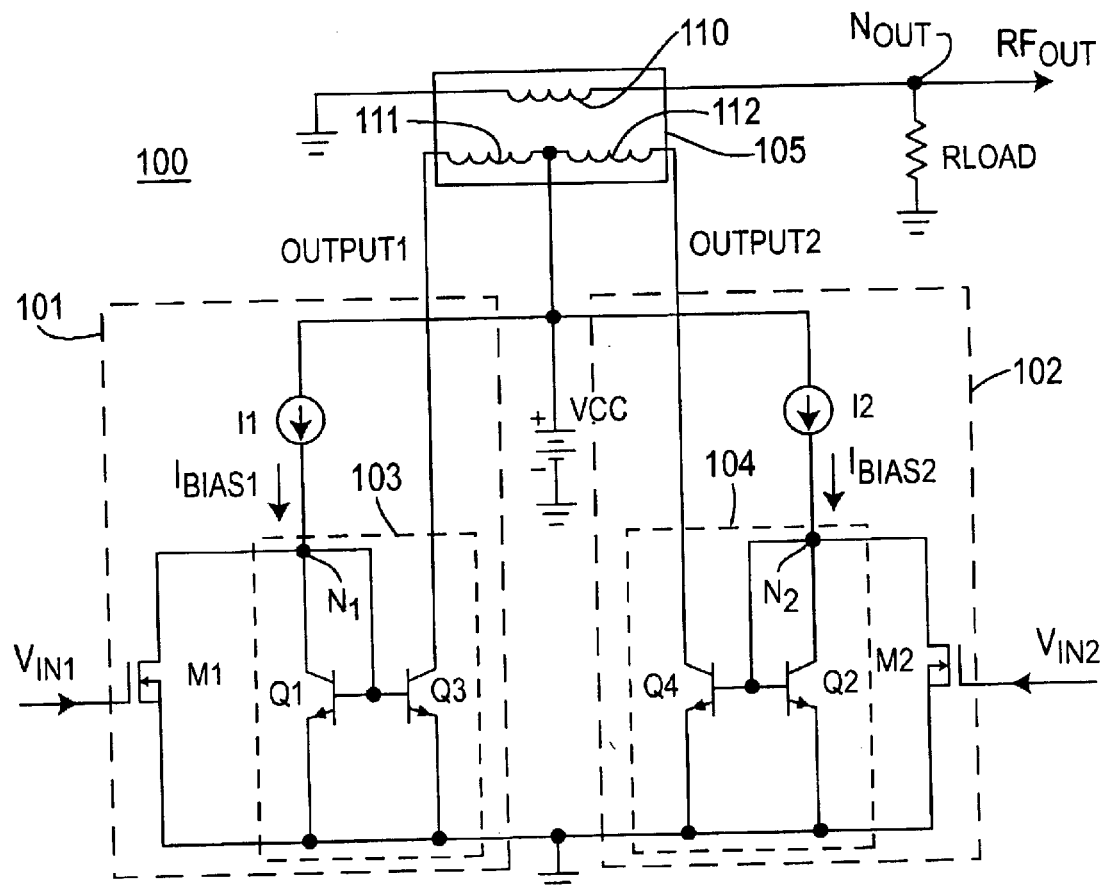
FIG. 1 shows a radio frequency (RF) power amplifier circuit for generating RF pulses in accordance with an exemplary embodiment of the present invention.

FIG. 1 shows a radio frequency (RF) pulse power amplifier (PPA) circuit 100 for generating RF pulses in accordance with an exemplary embodiment of the present invention. RF PPA circuit 100 comprises first and second sections 101 and 102, balanced-to-unbalanced (balun) transformer 105, and load resistor Rload. RF PPA circuit 100 is configured as a push-pull RF power amplifier coupled to load resistor Rload through balun transformer 105. First section 101 comprises current source I1 providing bias current $I_{bias1}$, NMOS transistor M1, and transistor pair 103, which includes NPN transistors Q1 and Q3. Second section 102 comprises current source I2 providing bias current $I_{bias2}$, NMOS transistor M2, and transistor pair 104, which includes NPN transistors Q2 and Q4. The first and second sections 101 and 102 are symmetrical (e.g., each pair of transistors Q1 and Q2, transistors Q3 and Q4, and transistors M1 and M2 may have the same size) and operate in a similar manner.

Balun transformer 105 comprises two input windings 111 and 112, and one output winding 110, as shown. For the described embodiment of the present invention, input windings 111 and 112 and output winding 113 each have the same number of turns (i.e., the turns ratio is 1:1:1), but the present invention may be implemented with other turn ratios. The center tap of the balun transformer 105 is coupled to first sides of input windings 111 and 112, and to positive supply voltage VCC. The second side of winding 111 is coupled to the collector of transistor Q3, and the second side of winding 112 is coupled to the collector of transistor Q4 (shown in FIG. 1 at nodes OUTPUT1 and OUTPUT2). The output winding of balun transformer 105 is coupled across nodes $N_{OUT}$ and ground. Balun transformer 105 may typically be implemented separate from sections 101 and 102 and coupled to an integrated circuit (IC) having first and second sections 101 and 102. However, integrated realizations of balun transformers exist in the art and might also be included in an IC having first and second sections 101 and 102.

While the exemplary embodiment of the present invention is described with a balun transformer, one skilled in the art may instead use a circuit having other components, such as a complementary transistor driver pair, that may operate in a manner similar to that of the balun transformer for coupling the signals generated in the first and second sections to a load impedance to generate the RF pulse. Such circuits may in general be termed a signal combiner that drives a load impedance.

Current sources I1 and I2 might be embodied in any of a variety of implementations well known in the art, such as with a resistor coupled to positive supply VCC. Since the voltage across such resistor exhibits small variations, the resistor might be considered as an approximation of a current source. Other embodiments of the present invention may employ different implementations for a current source based on desired design characteristics for a given implementation of RF PPA circuit 100.

Figure 2:
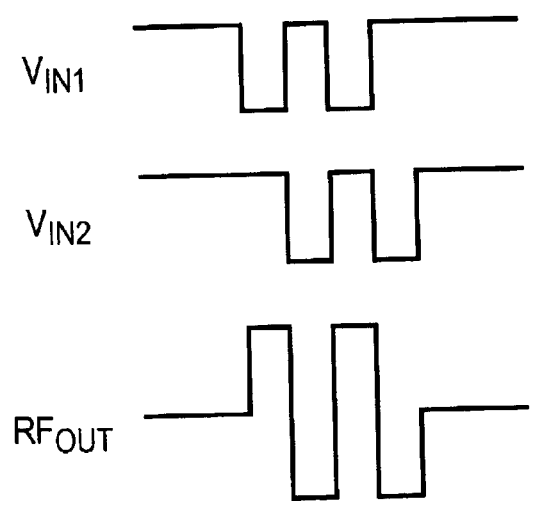
FIG. 2 shows a set of input and output waveforms used in conjunction with the RF power amplifier circuit of FIG. 1.

FIG. 2 shows a set of input and output waveforms used in conjunction with RF PPA circuit 100 of FIG. 1. Waveform $V_{IN1}$ is applied to the gate of transistor M1 of first section 101, while waveform $V_{IN2}$ is applied to the gate of transistor M2 of second section 102. Waveform RFout is an output pulse generated across load resistance Rload (across node $N_{OUT}$ and ground). While the exemplary embodiment of FIG. 1 shows Rload as a resistance, in general, the output pulse may be generated across an output impedance having real and/or imaginary components. This output impedence might comprise the antenna itself. For the described embodiment of FIG. 1, ground is a node having a common voltage potential different from VCC. To generate a symmetric output pulse RFout, waveform $V_{IN2}$ is preferably equivalent to waveform $V_{IN1}$ but delayed by 180 degrees. Given the input and output waveforms of FIG. 2, RF PA circuit 100 operates as a push-pull amplifier in class D (switching) mode.

Operation of RF PPA circuit 100 is now described. Transistor M1 and transistor Q1, in response to $V_{IN1}$, drive transistor Q3 to generate an output voltage at node OUTPUT1, while transistor M2 and transistor Q2, in response to $V_{IN2}$, drive transistor Q4 to generate an output voltage at node OUTPUT2. Such voltage at nodes OUTPUT1 and OUTPUT2 are generated at the second sides of windings 111 and 112, respectively, of balun transformer 105 and coupled to ground through transistors Q3 and Q4. Bias current $I_{bias1}$ is set by current source I1, and bias current $I_{bias2}$ is set by current source I2. Current $I_{bias1}$ flows through transistor Q1 when transistor M1 is "off" (i.e., $V_{IN1}$ is low) and, similarly, $I_{bias2}$ flows through transistor Q2 when transistor M2 is off (base currents in Q3 and Q4 may be relatively small and may be considered negligible). Transistor Q3 is configured to operate as a current mirror for transistor Q1, so that the mirror is controlled by the non-mirror. Thus, the ratio of i) the current $I_{Q3}$ flowing through transistor Q3 to ii) the current $I_{Q1}$, flowing through transistor Q1 (i.e., current ratio $I_{Q3}/I_{Q1}$) is related to the emitter-area ratio of these two transistors Q3 and Q1. Transistors Q4 and Q2 are similarly configured.

Transistors M1 and M2 have digital input signals $V_{IN1}$ and $V_{IN2}$ applied to their respective gates. The voltage drop across each of the transistors M1 and M2 is generated by the corresponding digital input signal, and the voltage drop biases the bases of transistors Q1, Q2, Q3, and Q4. Such bias at the bases of transistors Q1, Q2, Q3, and Q4 controls flow of currents $I_{bias1}$, and $I_{bias2}$, through transistor pairs 103 and 104, respectively. Initially, digital input signals $V_{IN1}$ and $V_{IN2}$ are high, turning transistors M1 and M2 "on" (current flows through the transistor). Consequently, the bases of transistors Q1, Q2, Q3, and Q4 may be biased at about +0.5V, which shuts transistors Q1, Q2, Q3, and Q4 "off" (negligible current flows through the transistor). Because of the diode-like current-voltage (I–V) characteristic of a base-emitter diode, transistors M1 and M2 might shut transistors Q1, Q2, Q3, and Q4 on and off relatively rapidly.

For preferred implementations of the exemplary embodiment, the total bias voltage swing at the bases of transistors Q3 and Q4 (at nodes $N_1$, and $N_2$) to turn these transistors on and off is relatively small: on the order of about 0.3–0.4V. As is known in the art, when transistor pairs 103 and 104 comprise bipolar transistors, the bipolar transistors exhibit a relatively high capacitance, which may be relatively difficult for a MOS transistor to switch (drive) through a large voltage swing at high speed. However, for RF PPA circuit 100, the total bias voltage swing at nodes $N_1$ and $N_2$ is relatively small, so that very little time is required for current sources I1 and I2 to pull the voltages at nodes OUTPUT1 and OUTPUT2 up, and for transistors M1 and M2 to pull the voltages at nodes OUTPUT1 and OUTPUT2 down.

The following describes operation of first section 101 when pulsed with input waveform $V_{IN1}$, but first and second sections 101 and 102 operate in a similar manner. As described above, when $V_{IN1}$ is at a high value, transistor M1 is "on" and current $I_{bias1}$ is shunted through transistor M1, shutting transistors Q1 and Q3 of transistor pair 103 off. At a given point, the waveform $V_{IN1}$ switches to a low value, turning transistor M1 off. Bias current $I_{bias1}$ adjusts the bias of the bases of transistors Q1 and Q3 to approximately +0.8 to +0.9V, turning transistors Q1 and Q3 on. A relatively large output current now flows into the node OUTPUT1, which output current is equal to $I_{bias1}$ times the emitter-area ratio of transistor Q3 and Q1. When $V_{IN1}$ subsequently switches back to a high value, transistor M1 turns on again, and current $I_{bias1}$ is again shunted through transistor M1. In response, the bias applied to the bases of transistors Q1 and Q3 returns to approximately +0.5V and current stops flowing into node OUTPUT1.

Similar operation of second section 102 causes a large current to flow into node OUTPUT2 during the period when digital input signal $V_{IN2}$ switches from high to low and back to high again. However, the current flowing into node OUTPUT2 is at a 180-degree delay with respect to the current flow OUTPUT1 resulting from the switching of the digital input signal $V_{IN1}$.

The two output signals at nodes OUTPUT1 and OUTPUT2 are coupled to balun transformer 105. The center tap coupling the first sides of input windings 111 and 112 of balun transformer 105 is connected to the positive supply voltage VCC, and the second sides of input windings 111 and 112 are coupled to nodes OUTPUT1 and OUTPUT2, respectively. Transistors Q3 and Q4 drive balun transformer 105 in a push-pull manner. When OUTPUT1 sinks current, the output voltage across winding 110 (between nodes $N_{OUT}$ and ground) of balun transformer 105 drives current through load resistor Rload in one direction. When OUTPUT2 sinks current, the output voltage across winding 110 drives current through load resistor Rload in the opposite direction. When digital input signals $V_{IN1}$ and $V_{IN2}$ are applied to RF PPA circuit 100 as shown in FIG. 2, an RF pulse is generated as an output voltage $RF_{OUT}$ across load resistor Rload.

While the present invention is described with respect to a pulse power amplifier generating RF pulses, the present invention is not so limited, and may be employed to generate pulses within any number of frequency bands. Also, as would be apparent to one skilled in the art, the present invention may be extended to multiple input signals to each of the first and second sections. For such embodiments, each input signal may have a corresponding MOS transistor, each of the MOS transistors being combined with the others in a logic OR configuration and coupled to the transistor pair in a similar manner to that described for the MOS transistor of FIG. 1.

The pulse power amplifier dissipates relatively large output power only when pulses are generated, thus providing for efficient operation by dissipating relatively low levels of quiescent power. In addition, when pulses are being generated, the dissipated power of the circuit might be low in comparison to the output power of the circuit because transistors of the pulse power amplifier may be driven as switches. Consequently, the present invention may be employed in integrated circuit (IC) implementations, such as BiCMOS implementations, of circuits for telecommunications transceivers. Such transceivers might be employed for wireless networking and cellular/wireless communications.

Thus, a pulse power amplifier operating in accordance with the present invention may provide for the following advantages. A first advantage of a pulse power amplifier circuit operating in a push-pull configuration with a balun transformer allows greater voltage swing across load resistor Rload than might be obtained using a direct connection between a transistor and the load. Consequently, a relatively low supply voltage allows for a relatively large output power. For example, supply voltage VCC may be equal to 3.3V, transistors Q3 and Q4 may operate with at least +0.8V collector voltage to avoid saturation (saturation reduces the frequency response of bipolar transistors), and the output voltage may exceed the supply voltage (3.3V). For these parameters, the total output swing of a directly connected circuit configuration may only be 2.5V peak-to-peak. In contrast, the exemplary embodiment of FIG. 1 may achieve 5V peak-to-peak (as $RF_{OUT}$) at node $N_{out}$, when the turns ratio of the balun transformer's three windings is 1:1:1. By increasing the turns ratio between output and input windings, even higher peak-topeak output voltages as $RF_{OUT}$ might be achieved (proportionately more current may flow into OUTPUT1 and OUTPUT2 when the turns ratio is increased).

A second advantage of a pulse power amplifier circuit operating as a class D amplifier (i.e., in switch mode) is that, when transistors M1 and M2 are each turned on so that no output current is flowing through Rload, very little power is dissipated (only the power that is dissipated as a result of the bias currents). Significant power may only be dissipated when transistor Q3 or transistor Q4 is turned on. Furthermore, because transistors Q3 and Q4 may be switched on and off rapidly, the voltage drop across transistors Q3 and Q4 may be relatively small when they are on (generally when transistors Q3 and Q4 are not driven into saturation). Therefore, less power may be dissipated in an implementation of the present invention than in an amplifier that operates in a linear or quasi-linear mode.

A third advantage of a pulse power amplifier circuit operating in accordance with an exemplary embodiment of the present invention is that the output voltage swing (and therefore power level) is set by currents $I_{bias1}$ and $I_{bias2}$. Consequently, by adjusting currents $I_{bias1}$ and $I_{bias2}$ using programmable current sources, the output power level might be programmable.

While the exemplary embodiment of the present invention is described herein with respect to transistors and other components implemented with SiGe BiCMOS integrated circuit (IC) technology, the present invention is not so limited and may be implemented in any number of IC technologies, such as any BiCMOS technology. In addition, while the present invention is described for an RF power amplifier based on a given push-pull transistor configuration with a balun transformer and current sources operating in Class D mode, the present invention is not so limited. One skilled in the art may extend the teachings of the described exemplary embodiment to other push-pull power amplifier configurations that operate in accordance with the principles described herein.

The present invention may be implemented as circuit-based processes, including possible implementation as a single integrated circuit, a multi-chip module, a single card, or a multi-card circuit pack.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A circuit comprising:
    a push-pull power amplifier configured to operate in a switching mode and comprising:
        a first section coupled to receive a first input signal and a second section coupled to receive a second input signal, wherein each of the first and second sections comprises a metal oxide semiconductor (MOS) transistor, a transistor pair, and a current source providing a bias current to the MOS transistor and the transistor pair,
        wherein the MOS transistor is coupled to the transistor pair so as to switch the bias current between the MOS transistor and the transistor pair in response to the corresponding input signal; and
    a signal combiner adapted to receive signals from the first and second sections to drive a load impedance,
    wherein, when the MOS transistor of the first section switches the bias current to the transistor pair, the transistor pair drives the load impedance through the signal combiner in one direction, and, when the MOS transistor of the second section switches the bias current to the transistor pair, the transistor pair drives the load impedance through the signal combiner in another direction.

2. The invention of claim 1, wherein the power amplifier drives the load impedance so as to generate a first portion of the pulse in response to the first input signal and drives the load impedance so as to generate a second portion of the pulse in response to the second input signal.

3. The invention of claim 2, wherein the second input signal is substantially equivalent to the first input signal and delayed by about 180-degrees.

4. The invention of claim 1, wherein:

the signal combiner is a balanced-to-unbalanced (balun) transformer having i) an output winding coupled across a load impedance and ii) first and second input windings coupled to the first and second sections, respectively, and wherein the first and second input windings of the balun transformer have first sides coupled to a common supply and second sides coupled to the first and second output nodes of the power amplifier, respectively, and wherein each current source is coupled to the common supply.

5. The invention of claim 4, wherein:

for each of the first and second sections, the transistor pair comprises first and second bipolar transistors, the collector and the base of the first bipolar transistor and the base of the second bipolar transistor coupled to the current source;

the first output node is coupled to the collector of the second transistor of the transistor pair of the first section, and the second output node is coupled to the collector of the second transistor of the transistor pair of the second section;

when the MOS transistor of the first section switches the bias current to the transistor pair, the bias current of the current source flows through each of the first and second bipolar transistors and the first input winding; and when the MOS transistor of the second section switches the bias current to the transistor pair, the bias current of the current source flows through each of the first and second bipolar transistors and the second input winding.

6. The invention of claim 1, wherein each current source is a programmable current source, wherein the bias current of each programmable current source sets a corresponding output power of the pulse.

7. The invention of claim 1, wherein each of the first and second sections further comprises at least one other MOS transistor coupled to the transistor pair, each MOS transistor adapted to receive a corresponding input signal.

8. The invention of claim 1, wherein the first section and the second section are embodied in an integrated circuit.

* * * * *